(12) United States Patent
Mizuta (10) Patent No.: US 11,138,349 B2
(45) Date of Patent: Oct. 5, 2021

(54) SYSTEM AND METHOD FOR SIMULATING TRAFFIC FLOW DISTRIBUTIONS WITH APPROXIMATED VEHICLE BEHAVIOR NEAR INTERSECTIONS

(71) Applicant: INTERNATIONAL BUSINESS MACHINES CORPORATION, Armonk, NY (US)

(72) Inventor: Hideyuki Mizuta, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 1171 days.

(21) Appl. No.: 14/960,080

(22) Filed: Dec. 4, 2015

(65) Prior Publication Data
US 2017/0161410 A1  Jun. 8, 2017

(51) Int. Cl.
*G06F 30/20* (2020.01)

(52) U.S. Cl.
CPC .................... *G06F 30/20* (2020.01)

(58) Field of Classification Search
CPC ...................................... G06F 30/20
See application file for complete search history.

(56) References Cited

U.S. PATENT DOCUMENTS

| | | | | |
|---|---|---|---|---|
| 5,801,943 A * | 9/1998 | Nasburg | ............... | G08G 1/0104 340/910 |
| 8,451,141 B2 | 5/2013 | Uechi et al. | | |
| 8,930,173 B2 | 1/2015 | Ikeda et al. | | |
| 2005/0137756 A1 * | 6/2005 | Takahashi | ............. | B60W 40/04 701/1 |
| 2010/0070253 A1 * | 3/2010 | Hirata | .................. | G08G 1/0104 703/8 |
| 2012/0203528 A1 * | 8/2012 | Ikeda | ................... | G08G 1/0125 703/8 |

(Continued)

OTHER PUBLICATIONS

Werling et al. Automatic Collision Avoidance Using Model-predictive Online Optimization, 51st IEEE Conference on Decision and Control Dec. 10-13, 2012. Maui, Hawaii, USA, p. 6309-6314 (Year: 2012).*

(Continued)

*Primary Examiner* — Omar F Fernandez Rivas
*Assistant Examiner* — Michael Edward Cocchi
(74) *Attorney, Agent, or Firm* — Tutunjian & Bitetto, P.C.; Randall Bluestone (57) ABSTRACT

A computer-implemented method and system for simulating traffic flow configurations. The method includes simulating vehicle traffic on a virtual roadway configuration in a simulated environment using a car-following model to provide simulated vehicle traffic at an intersection, wherein the car-following model includes vehicle parameters of at least one of a lead vehicle and a subsequent vehicle at each timestep, the lead vehicle positioned in front of the subsequent vehicle, and modifying the simulated vehicle traffic using a ghost vehicle approximation model to provide simulated traffic flow distributions while maintaining incident avoidance criteria, wherein the ghost vehicle approximation model includes setting a speed value and a gap distance value of a ghost vehicle positioned in front of the lead vehicle and/or the subsequent vehicle to modify the vehicle parameters of the lead vehicle and the subsequent vehicle at each timestep.

19 Claims, 6 Drawing Sheets

(56) References Cited

U.S. PATENT DOCUMENTS

2013/0041631 A1* 2/2013 Yang .................. G06N 3/006 703/2

OTHER PUBLICATIONS

Wolfermann et al., Modeling Speed Profiles of Turning Vehicles At Signalized Intersections, Sep. 14, 2011, 3rd International Conference on Road Safety and Simulation, p. 1-17 (Year: 2011).*

Enrique González Vélez, Adaptation of Vissim, a Dynamic Simulation Model, To the Traffic Behavior At Intersections in Mayagüez, Puerto Rico, May 2006, University of Puerto Rico Mayagüez Campus, p. 1-107 (Year: 2006).*

Cremer, J. et al., "A Directable Vehicle Behavior Model for Virtual Driving Environments," Proceedings of 1996 Conference on AI, Simulation, and Planning in High Autonomy Systems, Mar. 1996. (pp. 1-8).

Fujii, H. et al., "Development of Multi-Agent Based Traffic and Environmental Simulator MATES Third Report: Multilevel Pedestrian Model and Simulation for Mixed Traffic of Pedestrians and Cars," Transaction of the Japan Society for Simulation Technology, vol. 3, No. 3, Nov. 2011 (pp. 70-78).

Gipps, P.G., "A Behavioural Car-Following Model for Computer Simulation," Transportation Research Part B: Methodological, vol. 15 No. 2, Apr. 1981. (pp. 105-111).

Hara, S., "Predicting Halfway Through Simulation: Early Scenario Evaluation Using Intermediate Features of Agent-Based Simulations," Proceedings of the 2014 Winter Simulation Conference, Dec. 2014. (pp. 334-343b).

Khodayari, A. et al., "Modeling and Intelligent Control Design of Car Following Behavior in Real Traffic Flow," IEEE Conference on Cybernetics and Intelligent Systems (CIS), Jun. 2010. (pp. 1-7).

Mizuta, H. et al., "Traffic Simulation for Urban Planning—Data Analytics and What-if Simulation for Smarter Cities," Information processing, vol. 55, No. 6, Jun. 2014. (pp. 579-584).

Ogitsu, T. et al., "Automatic Driving Control for Passing through Intersection by use of Feature of Electric Vehicle," World Electric Vehicle Journal vol. 4, Nov. 2010. (pp. 1-10).

Uchida, H. et al., "Multi-Agent Based Traffic Simulation with Machine Learning," The 25th Annual Conference of the Japanese Society for Artificial Intelligence, Jun. 2011. (pp. 1-4).

Wang, H. et al., "Steering Behaviors for Autonomous Vehicles in Virtual Environments," IEEE Virtual Reality Proceedings, Mar. 2005. (pp. 155-162).

* cited by examiner

SYSTEM AND METHOD FOR SIMULATING TRAFFIC FLOW DISTRIBUTIONS WITH APPROXIMATED VEHICLE BEHAVIOR NEAR INTERSECTIONS

BACKGROUND

Technical Field

The present invention relates generally to simulating traffic flow distributions and, in particular, to simulating traffic flow distributions with approximated vehicle behavior near intersections.

Description of the Related Art

Traffic conditions on public roadways constantly fluctuate during the day due to various conditions experienced by drivers, including the number of vehicles on the road, weather conditions, time of day, behavior of drivers, etc. While traffic simulation systems can be used to predict various traffic scenarios, such as estimated arrival time of a traveling vehicle and/or level of congestion on a roadway, the behavior of traffic is highly complex due to constant fluctuations and/or variables, thereby making it difficult to obtain precise data on both a macroscopic and microscopic level. For example, many factors can affect the behavior of traffic, such as driver specific behaviors, physical roadway conditions, the number of alternative routes available to a given destination, number of vehicles on a particular route, timing and/or length of traffic signals, etc.

Currently, estimation of traffic flow leads to unnatural simulation results when traffic signal data cannot be obtained, which display vehicles traveling with a limited trip duration without deceleration at intersections, resulting in inaccurate data results and/or inefficient traffic flow estimations that do not accurately reflect the traffic flow actually experienced and/or observed by a driver. Imposing fixed limitations and/or restrictions on a speed of a vehicle at and/or near intersections, based on the speed limit (e.g., imposing fixed and/or constant values) such as half of the original speed limit and/or capped speeds (e.g., 5 meters/ second), further exacerbates inaccurate data results and/or inefficient traffic flow estimations, since such limitations on speed generate uniform shifts in trip duration without effecting traffic distribution in a city. Applying such fixed values on the speed of a vehicle at intersections can increase estimated trip duration similar with observed trip length, while the actual traffic flow distribution and/or route selection experienced and/or observed by the driver remains unaffected.

SUMMARY

According to an aspect of the present principles, a computer-implemented method for simulating traffic flow distributions is provided. The computer-implemented method includes simulating vehicle traffic on a virtual roadway configuration in a simulated environment using a car-following model to provide simulated vehicle traffic at an intersection, wherein the car-following model includes vehicle parameters of at least one of a lead vehicle and a subsequent vehicle at each timestep, the lead vehicle positioned in front of the subsequent vehicle, modifying the simulated vehicle traffic using a ghost vehicle approximation model to provide simulated traffic flow distributions while maintaining incident avoidance criteria, wherein the ghost vehicle approximation model includes setting at least one of a speed value and a gap distance value of a ghost vehicle positioned in front of at least one of the lead vehicle and/or the subsequent vehicle to modify the vehicle parameters of the at least one of the lead vehicle and the subsequent vehicle at each timestep.

According to another aspect of the present principles, a traffic simulation system having at least a processor and a memory device for simulating traffic flow distributions is provided. The traffic simulation system includes a car-following estimation unit to simulate vehicle traffic on a virtual roadway configuration in a simulated environment using a car-following model to provide simulated vehicle traffic at an intersection, wherein the car-following model includes vehicle parameters of at least one of a lead vehicle and a subsequent vehicle at each timestep, the lead vehicle positioned in front of the subsequent vehicle, and a ghost vehicle approximation unit to modify the simulated vehicle traffic using a ghost vehicle approximation model to provide simulated traffic flow distributions while maintaining incident avoidance criteria, wherein the ghost vehicle approximation model includes setting at least one of a speed value and a gap distance value of a ghost vehicle positioned in front of at least one of the lead vehicle and/or the subsequent vehicle to modify the vehicle parameters of the at least one of the lead vehicle and the subsequent vehicle at each timestep According to yet another aspect of the present principles, there is provided a non-transitory computer readable storage medium comprising a computer readable program for simulating traffic flow distributions. The computer readable program, when executed on a computer, causes the computer to perform the steps of simulating vehicle traffic on a virtual roadway configuration in a simulated environment using a car-following model to provide simulated vehicle traffic at an intersection, wherein the car-following model includes vehicle parameters of at least one of a lead vehicle and a subsequent vehicle at each timestep, the lead vehicle positioned in front of the subsequent vehicle, and modifying the simulated vehicle traffic using a ghost vehicle approximation model to provide simulated traffic flow distributions while maintaining incident avoidance criteria, wherein the ghost vehicle approximation model includes setting at least one of a speed value and a gap distance value of a ghost vehicle positioned in front of at least one of the lead vehicle and/or the subsequent vehicle to modify the vehicle parameters of the at least one of the lead vehicle and the subsequent vehicle at each timestep.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Systems and methods for simulating traffic flow distributions with approximated vehicle behavior near intersections are provided. The present principles are particularly directed to the problem of providing simulated traffic flow distributions more closely correlated to traffic flow distributions observed at any particular roadway configuration, which more accurately reflects the traffic flow experienced and/or observed by a driver by using approximated vehicle behavior at intersections or places where vehicles tend to decelerate. The systems and methods disclosed herein may provide an increased correlation coefficient representing a relationship of traffic flow between simulated results using a ghost vehicle approximation model and actual observed traffic flow results, such effects illustrating a total overall traffic flow of a particular area (e.g., city). The present principles may be employed to simulate traffic flow in a simulated environment in the absence of traffic signal data, as it may be difficult to obtain real signal data, such as cycle time and offset for each traffic signal. In a further embodiment, the intersections which apply the ghost vehicle approximation model may be limited and/or restricted to intersections connecting to main and/or primary roads, while excluding intersections of non-primary roads (e.g., back roads), thereby increasing computational efficiency and decreasing computational cost.

It should be understood that while the present principles disclosed herein describe embodiments relating to vehicle behaviors at an intersection of a route (e.g., roadway), other environments and/or road conditions where vehicles tend to decelerate are contemplated. For example, intersections many include, but are not limited to, one or more roads which may include traffic signals (e.g., traffic lights, stop signs, yield signs, etc.). Other environments and/or road conditions where vehicles tend to decelerate and subsequently accelerate include, but are not limited to, railroad crossings, road construction, road impairments, accidents, pedestrian crosswalks, checkpoints (e.g., border patrol), bridge crossings, etc. In addition, the present principles may also be applied to various types of vehicles, including trains. For ease of illustration, the systems and methods disclosed herein will be described with reference to intersections and vehicles on roadways, however such terminology should not be interpreted as limiting to the present principles. Of course, this and other exemplary situations and problems to which the present principles can be applied.

The present principles may simulate vehicle traffic based on a car-following model, the car-following model including vehicle parameters such as a position value, a speed value, and a gap distance value (e.g., location) of each vehicle, and/or a destination information of each vehicle in a simulated environment, wherein the vehicles include at least one of a lead vehicle, a subsequent vehicle (e.g., the lead vehicle being positioned in front of the subsequent vehicle), and/or a turning vehicle. In an embodiment, the position value, the speed value, gap distance value, and/or destination information may be used to generate and/or provide simulated vehicle traffic using the car-following model.

In an embodiment, the vehicle parameters of each vehicle may be determined at each timestep using the car-following model, such as, but not limited to, Gipps' model. Gipps' model is a car following model based on vehicle behavior and/or vehicle expectancy in a traffic flow. For example, Gipps' model may employ limitations on driver and/or vehicle parameters for safety purposes and/or mimic the traits of subsequent vehicles following lead vehicles in the front of the traffic flow. In one embodiment, the maximum acceleration of a subsequent vehicle may be based on, for example, the speed and/or location of the lead vehicle at each timestep (e.g., second, millisecond, etc.).

The data upon which the car-following model are determined may be assigned and/or determined by a simulation device. For example, the simulation device may determine the vehicle parameters using set values for one or more of the position value, speed value, and/or gap distance value for one or more of the vehicles. In an alternate embodiment, one or more vehicle parameters may be detected on a physical roadway for vehicles traveling on the physical roadway by, for example, induction loops, cameras, and/or sensors (e.g., speed detectors, proximity detectors, etc.), and may be used as input for the car-following model. In yet a further alternative embodiment, the vehicle parameters for the vehicles traveling on the physical roadway may be explicitly provided to a receiving unit of the simulation device for input using, for example, a transmitter, transceiver, global positioning system (GPS), etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
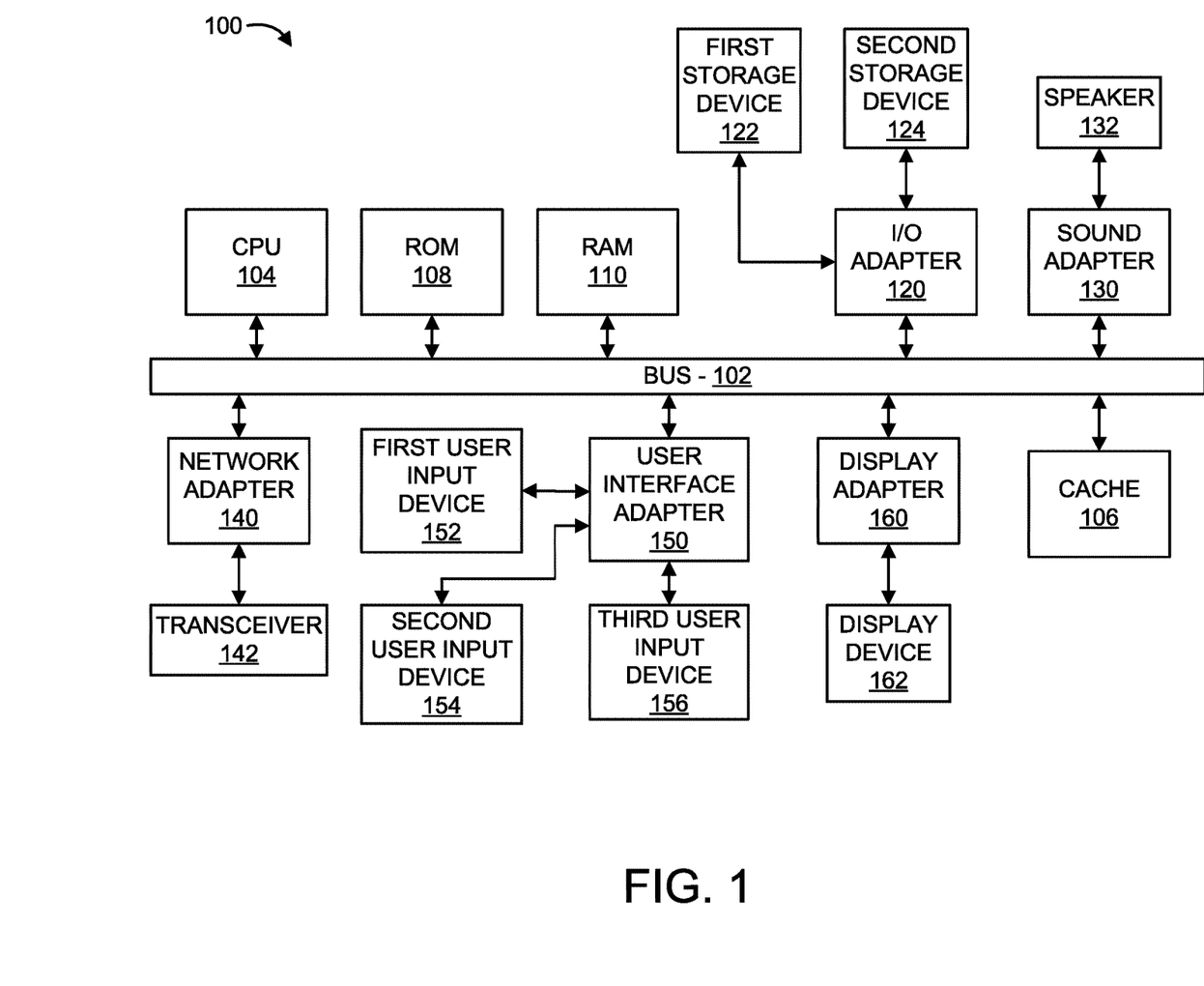
FIG. 1 is a block/flow diagram showing an exemplary processing system/method for evaluating traffic flow configurations, in accordance with an embodiment of the present invention.

Referring to the drawings in which like numerals represent the same or similar elements and initially to FIG. 1, an exemplary system 100 for implementing respective embodiments of the present principles is illustratively depicted. Part or all of processing system 100 may be implemented in one or more of the elements of system 200 of FIG. 2, system 300 of FIG. 3, and/or system 400 of FIG. 4. Further, it is to be appreciated that processing system 100 may perform at least part of the method described herein including, for example, at least part of method 600 of FIG. 6.

The processing system 100 includes at least one processor, such as a computer processing unit (CPU) 104, operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160 are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, etc. The storage devices 122 and 124 can be the same type of storage device or different types of storage devices. In one embodiment, traffic environment at an intersection, intersection layout, and/or road angle information of connecting routes to the intersection may be stored on the first storage device 122 and/or the second storage device 124.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160. In one embodiment, approximated vehicle behavior and/or simulated traffic flow at an intersection may be displayed by display device 162.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Other types of input devices can also be used, while maintaining the spirit of the present principles. The user input devices 152, 154, and 156 can be the same type of user input device or different types of user input devices. The user input devices 152, 154, and 156 are used to input and output information to and from system 100.

The processing system 100 may also include other elements (not shown) or may omit some elements as shown, as readily contemplated by one of skill in the art. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present principles provided herein.

Figure 2:
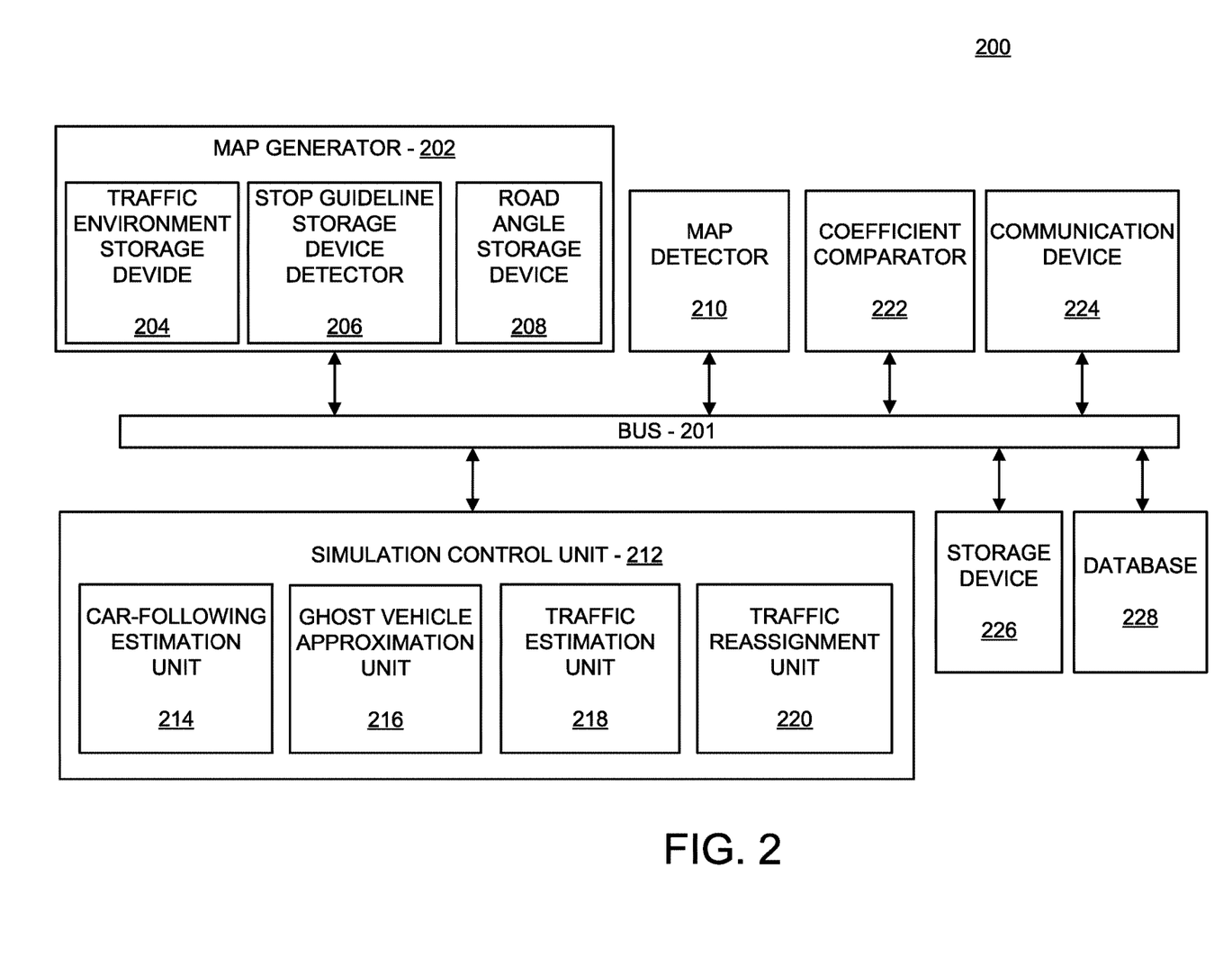
FIG. 2 is a block/flow diagram showing an exemplary system/method for simulating traffic flow distributions, in accordance with an embodiment of the present principles.

Moreover, it is to be appreciated that system 200 described below with respect to FIG. 2 is a system for implementing respective embodiments of the present principles. Part or all of processing system 100 may be implemented in one or more of the elements of system 200. Further, it is to be appreciated that processing system 200 may perform at least part of the method described herein including, for example, at least part of method 600 of FIG. 6.

Referring now to FIG. 2, with continued reference to FIG. 1, an exemplary method/system 200 for simulating traffic flow distributions is shown, in accordance with an embodiment of the present principles. The system 200 may include a map generator 202, a traffic environment storage device 204, a stop guideline storage device 206, a road angle storage device 208, a map detector 210, a simulation control unit 212, car-following estimation unit 214, a ghost vehicle approximation unit 216, a traffic estimation unit 218, a traffic reassignment unit 220, a coefficient comparator 222, a communication device 224, a storage device 226, and a database 228.

In an embodiment, the method/system 200 of FIG. 2 may be used as a computer tool that may be employed to generate roadway configurations, simulate vehicle traffic on roadway configurations, generate new roadway configurations and/or simulate vehicle traffic on new roadway configurations. In a further embodiment, system 200 may be employed as a computer tool to determine whether additional/alternate roadway configurations and/or roadway traffic signals, such as traffic lights, stop signs, and/or yield signs, improve traffic flow.

The map generator 202 may be configured to represent a roadway configuration in a simulated environment. For example, the map generator 202 may provide a virtual roadway configuration representative of a roadway configuration that is stored in, for example, the traffic environment storage device 204. In an embodiment, the roadway configuration includes at least one intersection. The map generator 202 may include, for example, the traffic environment storage device 204, the stop guideline storage device 206, and/or the road angle storage device 208. In an embodiment, the map generator 202 may employ at least one of the traffic environment storage device 204, the stop guideline storage device 206, and/or the road angle storage device 208 to represent the roadway configuration in the simulated environment.

The traffic environment storage device 204 may be configured to store general information regarding a surrounding area and/or area included in a zone of an intersection. For example, the traffic environment storage device 204 may be configured to store a predetermined amount of roads connecting to an intersection, how many lanes are included on each road, traveling directions of each lane, and/or designated turning lanes of the intersection. In addition, the traffic environment storage device 204 may be employed to provide lanes that are closed (e.g., due to construction, accidents, etc.). In a further embodiment, the traffic environment storage device 202 may provide an predetermined amount of vehicles at the intersection (e.g., traffic demand of a particular roadway and/or intersection). In an embodiment, the traffic environment storage device 204 may provide the map generator 202 with predetermined information regarding the intersection to represent the roadway configuration in a simulated environment, as described above.

In an alternative embodiment, the traffic environment storage device 204 may store and/or provide information of a physical roadway, which may be provided, for example, using a map detector 210 and/or a communication device 224. For example, the traffic environment storage device 204 may store information regarding an observed intersection, the observed intersection being captured by a map detector 210, such as an imaging processing device (e.g., camera), and communicated to the traffic environment storage device 204 via communication device 224. Accordingly, an actual observed roadway configuration may be used to represent the observed roadway in a simulated environment.

In a further embodiment, map generator 202 may be configured to represent a virtual roadway configuration of an observed roadway configuration using the map detector (210). In an embodiment, the map detector 210 may be configured to determine an environment of the intersection using image data comparison. For example, the map detector 210 may detect an image of a turning sign (e.g., an arrow painted on the lane indicating to a vehicle to turn) and compare the image to stored images, stored in database 228, to determine whether or not a lane is a designated turning lane. In another example, the map detector 210 may detect an image of a construction sign along a route connected to the intersection and compare the image to stored images, stored in database 228, to determine whether or not a lane is closed. Accordingly, some of the methods and systems disclosed herein may be excluded from lanes that are closed, thereby increasing computational efficiency and decreasing computational cost. In a further embodiment, the map detector 210 may be configured to detect a stop guideline and/or a road angle and may be provided to the stop guideline storage device 206 and/or road angle storage device, as will be described in further detail below.

The stop guideline storage device 206 may be configured to store information related to a stopping point of the intersection, such as a painted stop line positioned perpendicular to a lane. In an embodiment, the stop guideline storage device 204 may provide the map generator 202 with predetermined information, or determined information, regarding the stopping point of the intersection to represent the roadway configuration in the simulated environment, as described above.

The road angle storage device 208 may be configured to store a predetermined road angle θ, or determined road angle, of the same and/or different road connected to the intersection. For example, the road angle storage device 208 may store the angle in which a turning vehicle must turn. In an embodiment, when a turning vehicle traveling along a first route is present, the road angle storage device 208 may provide the map generator 202 with the predetermined road angle between the first route and a target and/or connecting route to represent the roadway in the simulated environment.

The simulation control unit 212 may be configured to simulate vehicle traffic on the virtual roadway configuration in the simulated environment using a car-following estimation unit 214 to provide simulated vehicle traffic. The car-following estimation unit 214 may include vehicle parameters of each vehicle on the virtual roadway configuration, such as position values, speed values and/or gap distance values of each vehicle at each timestep at an intersection. In an embodiment, the simulation control unit 212 may be configured to provide virtual vehicles on the virtual roadway configuration and/or assign each vehicle an origin, a destination, and/or a departure time as a trip according to an origin-destination (OD) table, which may be stored in storage device 226. In a further embodiment, the simulation control unit 212 may be configured to track the location of each vehicle and/or record information regarding each vehicle, such as position and speed, into log files stored in storage device 226. The simulation control unit 212 may include a car-following estimation unit 214, a ghost vehicle approximation unit 216, a traffic estimation unit 218, and/or a traffic reassignment unit 220.

In an embodiment, the simulation control unit 212 may be configured to simulate vehicle traffic based on a car-following model provided by the car-following estimation unit 214. The car-following estimation unit 214 may provide vehicle parameters for each vehicle on the virtual roadway configuration at each timestep, such as a position value, a speed value, and a gap distance value (e.g., location), and/or a destination information of each vehicle in the simulated environment. For example, the car-following estimation unit 214 may determine the vehicle parameters using set values for one or more of the position value, speed value, and/or gap distance value for one or more of the vehicles. As described above, the vehicles include at least one of a lead vehicle, a subsequent vehicle (e.g., the lead vehicle being positioned in front of the subsequent vehicle), and/or a turning vehicle. In an embodiment, the position value, the speed value, gap distance value, and/or destination information may be used to generate and/or provide simulated vehicle traffic using the car-following model. In a further embodiment, the car-following model may be based on Gipps' model or any similarly functioning models.

In a further embodiment, the simulation control unit 212 may be configured to modify the simulated vehicle traffic using a ghost vehicle approximation model provided by the ghost vehicle approximation unit 216. The ghost vehicle approximation unit 216 may provide and/or set vehicle parameters for a ghost vehicle positioned in front of the lead vehicle, subsequent vehicle, and/or turning vehicle. The vehicle parameters of the ghost vehicle may include, but is not limited to, a speed value, a gap distance value, etc. In an embodiment, the vehicle parameters of the ghost vehicle may be set to modify the vehicle parameters of the lead vehicle, subsequent vehicle, and/or turning vehicle. For example, a gap distance value between the ghost vehicle and the lead vehicle may be set to modify the vehicle parameters of the lead vehicle, such as speed, when the lead vehicle approaches an intersection.

In an embodiment, the speed value and/or gap distance value between the ghost vehicle and a subsequent vehicle (e.g., lead vehicle, subsequent vehicle, and/or turning vehicle) may be predefined such as to exclude values that would not impact and/or not modify the vehicle parameters of the subsequent vehicle. For example, in one embodiment, the gap distance value between the ghost vehicle and the subsequent vehicle may include maximum gap values, wherein the maximum gap values provide at least a minimum modification to the vehicle parameters of the subsequent vehicle. If the gap and/or speed values of the ghost vehicle are too large, the ghost vehicle gives only little effect to the lead vehicle.

In another embodiment, the gap distance value between the ghost vehicle and the subsequent vehicle may include minimum gap values, wherein the minimum gap values provide at least a maximum modification to the vehicle parameters of the subsequent vehicle while maintaining incident avoidance criteria. For example, a maximum gap distance value may include all values while excluding values that would cause the ghost vehicle and the subsequent vehicle to collide. If the gap and/or speed values of the ghost vehicle are too small, the lead vehicle may be forced to decrease its speed extremely rapidly and/or may cause collisions between the vehicles in the simulated environment. In an embodiment, the incident avoidance criteria may include, but is not limited to, a safe distance between the vehicles so as to prevent any collision of the vehicles, abrupt swerving of the vehicles, unattainable braking characteristics of the vehicles, etc.

By calibrating these vehicle parameters using the ghost vehicle approximation model, the simulation control unit 212 may generate and/or provide simulated traffic flow distributions. Accordingly, the simulation control unit 212 may simulate the vehicle behavior at an intersection on a microscopic level.

In a further embodiment, the simulation control unit 212 may simulate vehicle traffic based on vehicle parameters of a turning vehicle at each timestep. For example, the vehicle parameters of the turning vehicle may be determined by using the car-following model described above. The simulation control unit 212 may then modify the simulated vehicle traffic using the ghost vehicle approximation model such that the ghost vehicle approximation model includes setting the speed value and/or the gap distance value of the ghost vehicle to modify the vehicle parameters of the turning vehicle at each timestep.

In an embodiment, setting the speed value of the ghost vehicle may include determining a a road angle between a first road and a target road connected by the at least one intersection. In a further embodiment, the simulation control unit 212 may modify the speed value of the ghost vehicle based on the road angle determined/set by the road angle storage device 208. For example, the speed value of the ghost vehicle may be modified as a function of the road angle, such that $V=(1+\cos(\theta))/2$, where V represents the speed of the ghost vehicle, and $\theta$ represents the road angle. Accordingly, the speed of the ghost vehicle and/or turning vehicle substantially decreases as the vehicle turns, whereas the speed value of a vehicle traveling substantially straight does not change significantly.

The traffic estimation unit 218 may be configured to test at least one alternative roadway configuration in the simulated environment using the simulated traffic flow distributions, wherein the simulated traffic flow distributions are based on the car-following model and the ghost vehicle approximation model to determine a difference in traffic flow. The at least one alternative roadway configuration may include, for example, but is not limited to, an additional lane, a traffic signal, a traffic pattern, etc. For example, the traffic estimation unit 218 may modify the virtual roadway configuration to include the alternative roadway configuration to determine whether a positive and/or negative effect on the traffic flow occurs. The car-following model and ghost vehicle approximation model may provide key characteristics and/or behaviors of the intersection, and may be used in further embodiments to, for example, determine traffic flow and/or effectiveness of alternative conditions and courses of action in what-if scenarios (e.g., traffic reconfiguration, construction scheduling, etc.).

For example, the traffic estimation unit 218 may modify at least one roadway configuration in the intersection in the simulated environment based on the car-following model and ghost vehicle approximation model to determine whether re-routing traffic positively or negatively affects traffic flow at a particular intersection. In another example, the traffic estimation unit 218 may determine whether expanding and/or decreasing the amount of lanes on a road positively or negatively affects traffic flow and/or reduced traffic congestion. These and other what-if scenarios are readily contemplated by the present principles. In an embodiment, the traffic estimation unit 218 may be employed to test at least one alternative roadway configuration with decreased computational load and/or in the absence of traffic signal data, since vehicle behavior may be approximated based on the speed value and/or gap distance value of the ghost vehicle.

The traffic reassignment unit 220 may be configured to modify the virtual roadway configuration with the least one alternative roadway configuration when the difference in traffic flow occurs. For example, when the traffic estimation unit 218 tests an alternative roadway configuration in the simulated environment and a difference in traffic flow occurs (e.g., a positive effect), the traffic reassignment unit 220 may modify the virtual roadway configuration with alternative roadway configuration. As another illustrative example, the traffic estimation unit 218 may be configured to update a virtual map of the virtual roadway configuration to provide a blueprint of a new virtual roadway configuration which includes the alternative roadway configuration.

The coefficient comparator 222 may be configured to compare the simulated results based on the simulated traffic flow distribution to an observed traffic flow on the observed roadway configuration. In an embodiment, the coefficient comparator 222 may generate a correlation coefficient. The correlation coefficient may represent the correlation between the simulated traffic flow distribution and the observed traffic flow at the intersection to determine the effectiveness of the simulated vehicle traffic. In an embodiment, the correlation coefficient may be between −1 and 1, 1 being a maximum correlation between the simulated traffic flow distribution and the observed traffic flow.

The storage device 226 may be configured to store information related to the roadway configuration, the virtual roadway configuration, simulated results from the simulated traffic flow distribution. For example, the storage device 226 may store information regarding speed and/or gap distance information with corresponding timestamps to determine particular traffic flows throughout the day. In further embodiments, the storage device 226 may be configured to store general information regarding an intersection determined by, for example, the map generator 202.

In the embodiment shown in FIG. 2, the elements thereof may be interconnected by a bus 201. However, in other embodiments, other types of connections can also be used. Moreover, in an embodiment, at least one of the elements of system 200 is processor-based. Further, while one or more elements may be shown as separate elements, in other embodiments, these elements can be combined as one element. These and other variations of the elements of system 200 are contemplated.

Figure 3:
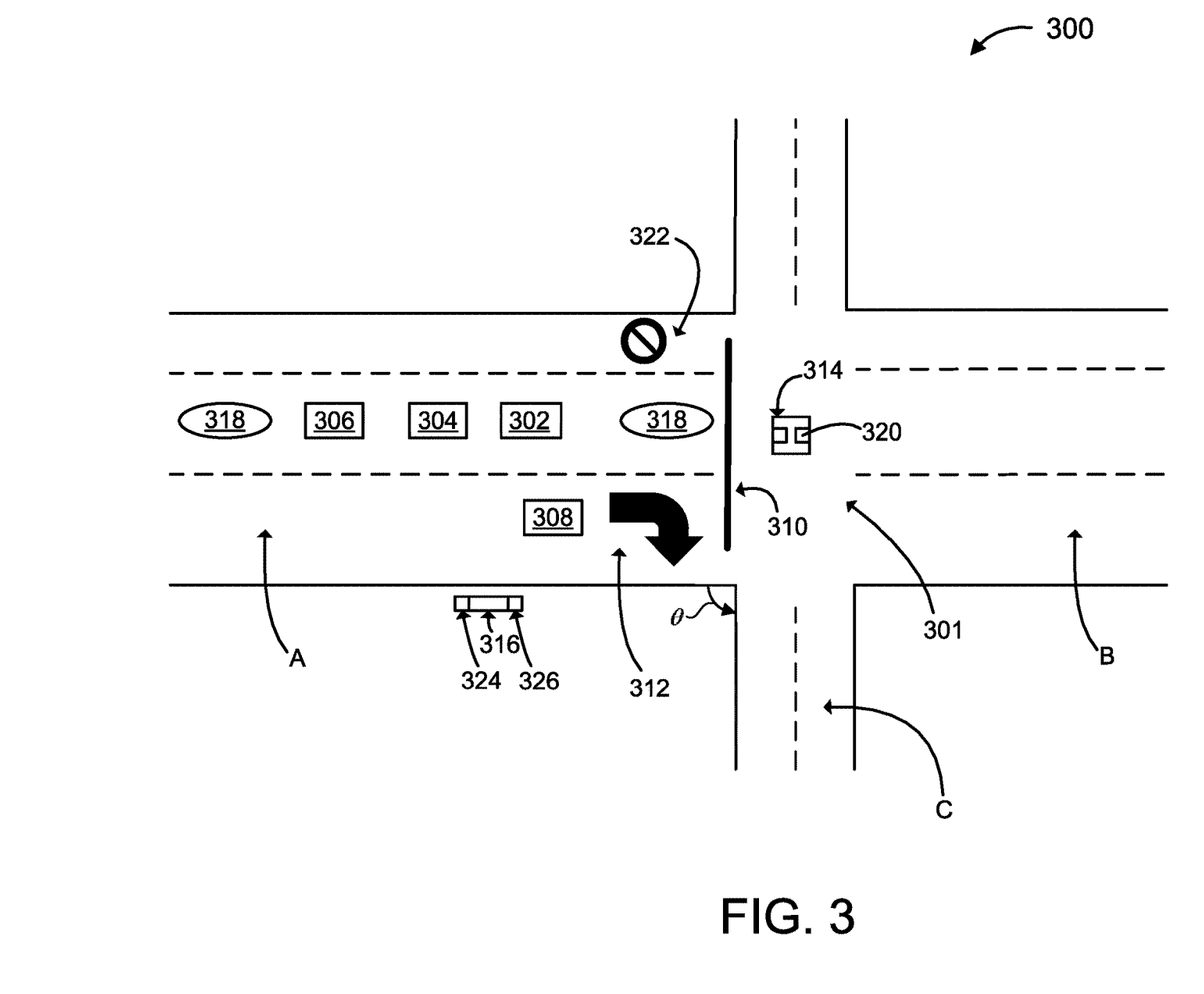
FIG. 3 is a diagram showing an exemplary system/method for simulating traffic flow distributions, in accordance with an embodiment of the present principles.

Now referring to FIG. 3, an exemplary method/system 300 for implementing one or more embodiments of the present principles is illustratively depicted. Part or all of processing system 300 may be implemented in one or more of the elements of system 100 and/or system 200. In such a case, the transceiver 142 of FIG. 1 may be replaced by a transmitter or receiver depending upon the element the processing system 300 or portion thereof is implemented in, connected to, and/or otherwise somehow involved with, as readily contemplated and understood by one of ordinary skill in the art, given the teachings of the present principles provided herein. Thus, when used herein, the term "transceiver" may be replaced by "transmitter" or "receiver" depending on the specific implementation.

FIG. 3 shows an exemplary method/system 300 for simulating traffic flow distributions, in accordance with an embodiment of the present principles. It should be understood that the exemplary method/system 300 depicted in FIG. 3 is representative of a virtual roadway configuration based in a simulated environment. The system 300 may be implemented on a roadway where vehicles travel, for example, on the right side of the roadway towards an intersection 301. Of course, it should be readily understood that the present principles may also be implemented on roadways where vehicles travel on the left side of the roadway. The intersection 301 may involve one or more roads meeting or crossing at a junction point, wherein each road may include one or more lanes traveling in one or more directions, however fewer and/or additional roads are contemplated (e.g., such as a railroad crossing). In the illustrative embodiment, the system 300 is shown having various locations indicated by the letters A, B, and C, such that vehicles 302, 304, and 306 are traveling straight toward location B, and vehicle 308 is turning toward location C.

In an embodiment, the intersection 301 may include a stop guideline 310 (e.g., a painted line) indicating a position where a lead vehicle 302 should stop at the intersection 301. In further embodiments, the intersection 301 may include one or more turn lanes 312 (e.g., turn bays) where vehicles may turn onto a connecting road of the intersection 301, such as location C. The one or more turn lanes 312 may include a road angle θ representing the degree of a turn. In some embodiments, road angle θ may include a minimum value of zero degrees and/or a maximum value of 360 degrees.

The system 300 may include and/or otherwise involve traffic signals 314, roadside cameras 316, one or more induction loops 318, and/or sensors 320. For example, induction loops 318 may be configured to detect the amount of vehicles and/or traffic demand at each timestep on an observed roadway configuration and may be used as input to represent vehicles passing and/or arriving at a certain point in a simulated environment, such as approaching the traffic signal 314 of the intersection 301. Sensors 320 may include, but are not limited to, proximity detectors, object recognition sensors, etc., and may be configured to determine and/or detect the presence of, for example, the stop guideline 310 (or other lane markers), a blocked lane 322 (e.g., construction equipment, road blocks, etc.), the road angle θ, the lead vehicle 304, and/or a subsequent vehicle 306. In an embodiment, the sensor 320 may exclude further detection in lanes that are determined to be a blocked lane.

In one embodiment, vehicle traffic on the virtual roadway configuration is simulated using a car-following model. The car-following model may include vehicle parameters, such as a speed value of a lead vehicle 304 a subsequent vehicle 306, and a turning vehicle 308 at each timestep. In a further embodiment, the vehicle parameters may include a gap distance value (e.g., position) between each vehicle at each timestep between the lead vehicle 304 and the subsequent vehicle 306. The speed value(s) and/or gap distance value(s) may be used as input of the car-following model to simulate vehicle traffic using any of system 100 of FIG. 1 and/or system 200 of FIG. 2.

The cameras 316 may be used, for example, to determine the presence of a blocked lane 322 on the observed roadway configuration to represent the block lane 322 in a simulated environment. It is readily contemplated that cameras 316 may be used instead of or in conjunction with sensors 320. The induction loops 318 and cameras 316 may communicate with the traffic signals 314 wirelessly (for example, by including their own transmitters or transceivers) or by wires (e.g., existing wires or newly laid wires), and/or any of system 100 of FIG. 1 or system 200 of FIG. 2 to provide information regarding the observed roadway configuration to generate the observed roadway configuration in a simulated environment and to provide the virtual roadway configuration of system 300. It should be understood that the amount and placement of the inductions loops 318 and/or the cameras 316 may vary.

As such, the cameras 316 may include and/or otherwise be connected to an object recognition unit 324 that may be employed to determine the stop guideline 310, and/or a block road 322 at and/or near the intersection 301. Such object recognition unit 324 may include and/or otherwise interface with a database 224 that includes pictures and/or other representations of vehicles, objects used when blocking a lane, and/or stop guidelines using, for example, an index. In implementations involving processing system 100 or a variation thereof, the database 326 may be implemented with respect to, for example, first storage device 122 and/or second storage device 124 of FIG. 1 and/or database 224 of FIG. 2.

A particular detailed embodiment of the present principles will be described below for the sake of illustration. However, it is to be appreciated that the present principles are not limited solely to the following embodiment and, thus, other embodiments, as well as variations of the following embodiment, may also be utilized in accordance with the teachings of the present principles, while maintaining the spirit of the present principles.

At each intersection 301, the roadway configuration may be represented in a simulated environment to provide a virtual roadway configuration. In a further embodiment, a car-following model may be employed to simulate vehicle traffic on the virtual roadway configuration in the simulated environment. The car-following model may include vehicle parameters of the lead vehicle 304, the subsequent vehicle 306 (e.g., vehicle positioned behind the lead vehicle 304), and/or the turning vehicle 308 at and/or near the intersection 301. In some embodiments, the distance between the intersection 301 and a lead vehicle 302 may include indefinite values, such as when there is no lead vehicle or other subsequent vehicles present. In some embodiments, only vehicles within a predetermined zone based on a predetermined distance from the intersection 301 and/or stop guidelines 310 may be employed, such as vehicles within 100 meters of the intersection 301. When a lead vehicle 304 and/or a subsequent vehicle 306 is present, a speed value and/or gap distance value of each vehicle may be determined by using the car-following model to provide simulated vehicle traffic.

In a further embodiment, a ghost vehicle 302 may be positioned in front of the lead vehicle 304 and/or the subsequent vehicle 306. Accordingly, the simulated vehicle traffic may be modified by using a ghost vehicle approximation model, wherein the vehicle parameters of the ghost vehicle 302 are set so as to modify the vehicle parameters of the lead vehicle 304 and/or subsequent vehicle 306 as the vehicles approach the intersection 301. In yet a further embodiment, a ghost vehicle 302 may be positioned in front of the turning vehicle 308. Accordingly, the simulated vehicle traffic may be modified by setting the vehicle parameters of the ghost vehicle 302 to modify the vehicle parameters of the turning vehicle 308. In an embodiment, the vehicle parameters of the ghost vehicle 302 may be represented as a function of the road angle θ.

Figure 4:
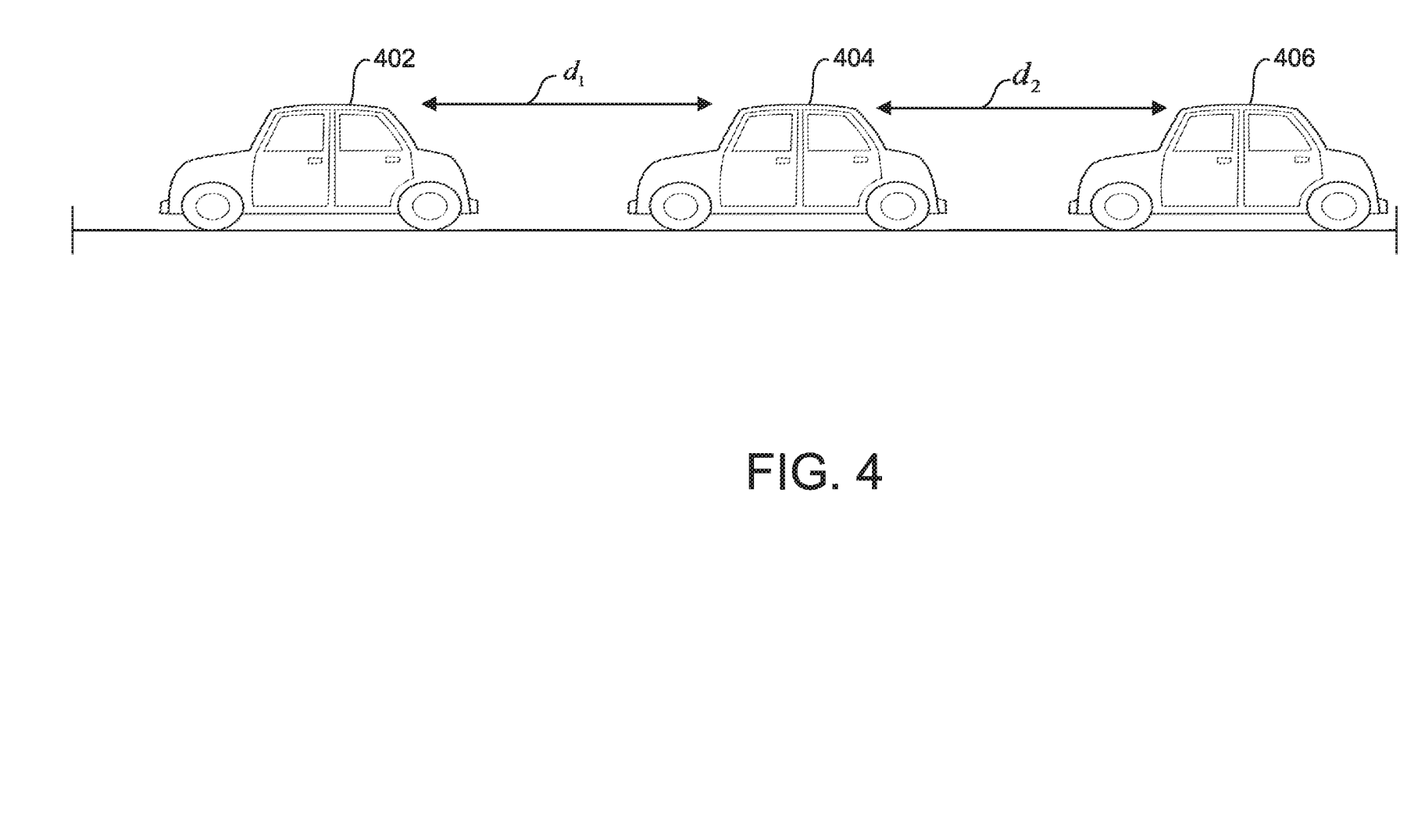
FIG. 4 is a diagram showing an exemplary system/method for simulating traffic flow distributions, in accordance with an embodiment of the present principles.

Now referring to FIG. 4, with continued reference to FIG. 3, a diagram showing an exemplary system/method for simulating traffic flow distributions, in accordance with an embodiment of the present principles, is illustratively depicted. In an embodiment, for example, a first gap distance $d_1$ between a ghost vehicle 402 may be set to modify the vehicle parameters of a lead vehicle 404 and/or a subsequent vehicle 406, such as the gap distance value $d_2$ between the lead vehicle 404 and the subsequent vehicle 406. Determining speed values and/or gap distance values between each subsequent vehicle may be repeated for an indefinite amount of subsequent vehicles. According to one embodiment, when the value of the gap distances decreases, the speed and/or acceleration of the vehicles decrease. According to another embodiment, when the value of the gap distances increases, the speed and/or acceleration of the vehicles may increase. An illustrative example of vehicle position and vehicle speed of a ghost vehicle approximation model at and/or near intersections is depicted in FIGS. 5A and 5B.

Figure 5A:
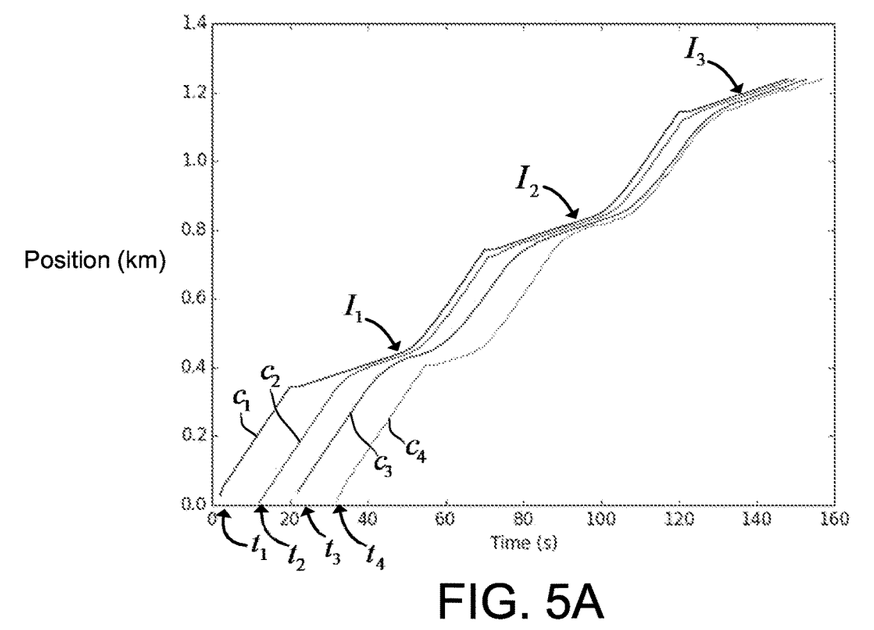
FIG. 5A is a graph diagram of a ghost vehicle approximation model showing an exemplary time series representation of vehicle position of four different vehicles, in accordance with an embodiment of the present principles.

In FIG. 5A, a graph diagram of a ghost vehicle approximation model showing an exemplary time series representation of vehicle position of four different vehicles is shown. For example, a lead vehicle $c_1$ is shown departing from an origin position (e.g., 0.0) at time $t_1$ (e.g., 0 seconds), driving toward first, second, and third intersections $I_1$, $I_2$, $I_3$ substantially located at 0.4 km, 0.8 km and 1.2 km away from the origin. Similarly, the ghost vehicle approximation model shows subsequent vehicles $c_2$, $c_3$, $c_4$ departing from the origin position at separate time intervals after the lead vehicle $c_1$ toward the intersections $I_1$, $I_2$, $I_3$, the time intervals represented by $t_2$, $t_3$, $t_4$ corresponding to subsequent vehicles $c_2$, $c_3$, $c_4$, respectively. As shown in FIG. 5A, a gap distance between the vehicles steadily decreases as the vehicles approach each of the intersections $I_1$, $I_2$, $I_3$, while a gap distance between the vehicles steadily increases as the vehicles depart from each of the intersections $I_1$, $I_2$, $I_3$.

Figure 5B:
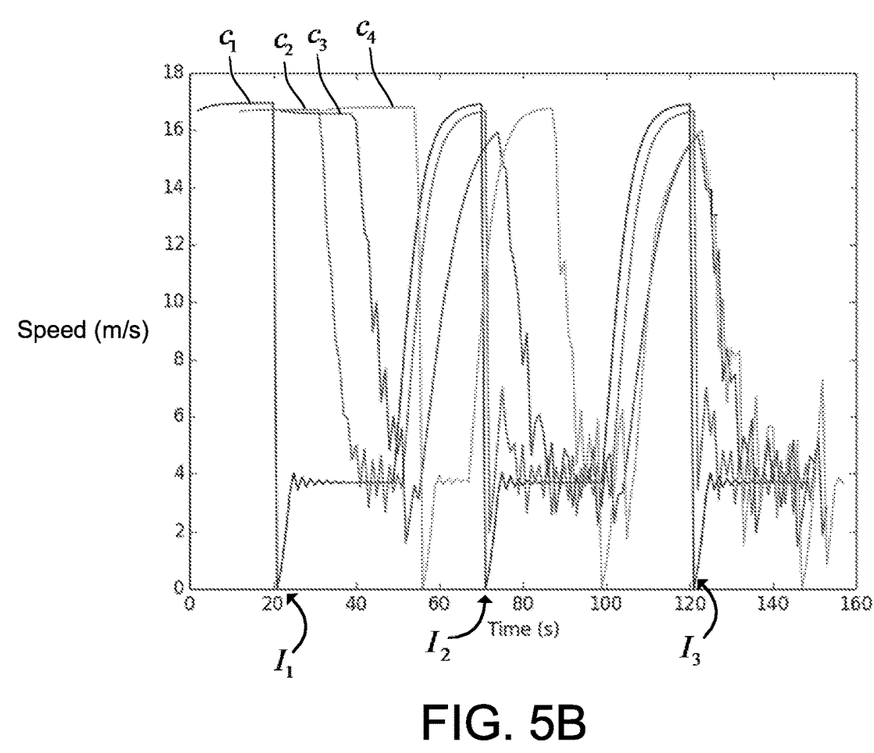
FIG. 5B is a graph diagram of a ghost vehicle approximation model showing an exemplary time series representation of vehicle speed of the four vehicles, in accordance with an embodiment of the present principles.

In FIG. 5B, a graph diagram of a ghost vehicle approximation model showing an exemplary time series representation of vehicle speed of the four vehicles is shown. The lead vehicle $c_1$ and subsequent vehicles $c_2$, $c_3$, $c_4$ correspond to the vehicles represented in FIG. 5A. In addition, the intersections $I_1$, $I_2$, $I_3$ correspond to the intersections depicted in FIG. 5A. As shown in FIG. 5B, the ghost vehicle approximation model illustrates that the speed of the vehicles decreases (e.g., deceleration) as the vehicles $c_1$, $c_2$, $c_3$, $c_4$ approach the intersections $I_1$, $I_2$, $I_3$, with a sharp peak of deceleration near the intersection $I_1$, $I_2$, $I_3$. In addition, FIG. 5B illustrates a steady increase in speed (e.g., acceleration) as the vehicles $c_1$, $c_2$, $c_3$, $c_4$ depart from the intersections $I_1$, $I_2$, $I_3$.

Figure 6:
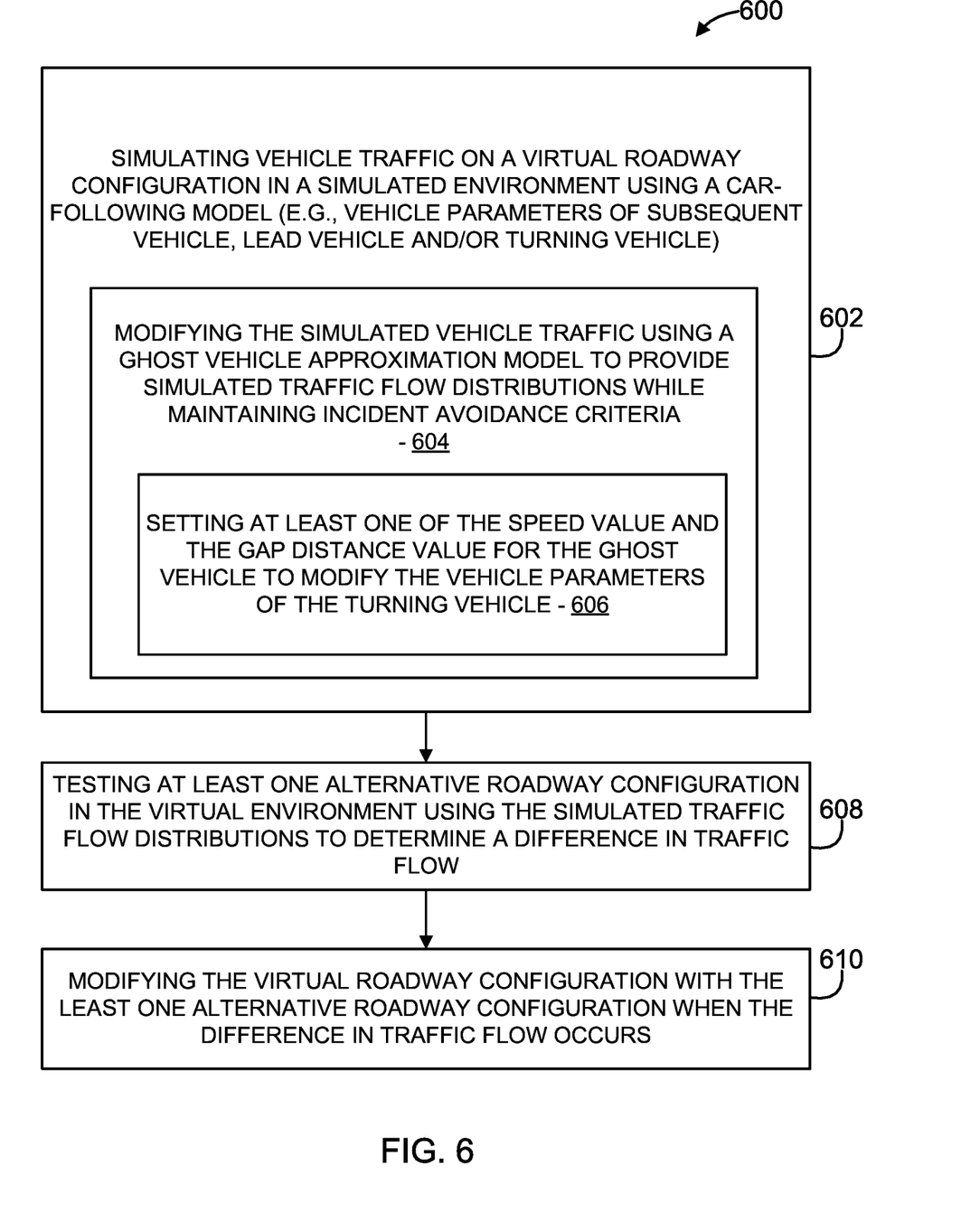
FIG. 6 is a block/flow diagram showing an exemplary system/method for simulating traffic flow distributions, in accordance with an embodiment of the present principles.

Now referring to FIG. 6, an exemplary method 600 for simulating traffic flow configurations is illustratively depicted, in accordance with an embodiment of the present principles.

In block 602, the method 600 may include simulating vehicle traffic on a virtual roadway configuration in a simulated environment using a car-following model to provide simulated vehicle traffic at an intersection. As described above, the car-following model may include vehicle parameters of a subsequent vehicle and a lead vehicle at each timestep, wherein the lead vehicle is positioned in front of the subsequent vehicle. In a further embodiment, simulating vehicle traffic may further include simulating vehicle traffic based on vehicle parameters of a turning vehicle at each timestep.

In block 604, the method may include modifying the simulated vehicle traffic using a ghost vehicle approximation model to provide simulated traffic flow distributions while maintaining incident avoidance criteria. The ghost vehicle approximation model may include setting at least one of a speed value and a gap distance value of a ghost vehicle positioned in front the subsequent vehicle and/or the lead vehicle to modify the vehicle parameters of the subsequent vehicle and the lead vehicle at each timestep. In a further embodiment, modifying the simulated vehicle traffic using the ghost vehicle approximation model may include setting at least one of the speed value and the gap distance value for the ghost vehicle to modify the vehicle parameters of the turning vehicle at each timestep, the ghost vehicle being positioned in front of the turning vehicle, as shown in block 606.

In block 608, the method 600 may include testing an alternative roadway configuration in the simulated environment using the simulated traffic flow distributions to determine a difference in traffic flow. For example, the alternative roadway configuration may include, but is not limited to, an additional lane, a traffic signal, and/or a traffic pattern. Additional alternative roadway configurations may include increasing the number of lanes of a roadway connected to the intersection, providing an additional roadway connected to the intersection, installing a roundabout at the intersection, reassigning traffic patterns at the intersection to reduce traffic congestion at the intersection.

In a further embodiment, the method 600 may include modifying the virtual roadway configuration with the least one alternative roadway configuration when the difference in traffic flow occurs, as shown in block 610. The present principles provide an efficient and effective way to determine whether or not a modification to a roadway system, including an intersection, would result in a difference in traffic flow, such as a reduction in traffic congestion and/or increase traffic flow. Accordingly, when a positive result in the virtual environment occurs based on a modification to the roadway system, the actual roadway system at the intersection may be modified by, for example, providing new roadway configuration renderings (e.g., blueprints).

The present principles may be employed to provide, for example, decision making choices to drivers based on travel time and route information, increased accuracy with respect to traffic visibility, and smart decision making with regards to construction plans and regulations. For example, more accurate data results may be provided to drivers to alter their intended path to a predetermined destination. In addition, more accurate data results may aid with efficiently scheduling construction and determining effective construction plans on particular roads (e.g., near intersections) such as to minimize the negative effect on traffic flow. For example, more precise data results may suggest the construction of a new road to reduce congestion and/or determine that a roundabout at an intersection provides more efficient traffic flow than a traffic light, according to the vehicle behavior at the particular intersection. As another example, the precise data results may be used to efficiently re-route traffic patterns in a city environment when a road is closed.

Having described preferred embodiments of a system and method for simulating traffic flow distributions with approximated vehicle behavior near intersections for traffic simulation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A computer-implemented method for simulating traffic flow distributions, comprising:

simulating vehicle traffic on a virtual roadway configuration in a simulated environment using a car-following model to provide simulated vehicle traffic at an intersection, wherein the car-following model includes vehicle parameters of at least one of a lead vehicle and a subsequent vehicle at each timestep, the lead vehicle positioned in front of the subsequent vehicle, and wherein intersections of non-primary roads are excluded from the simulated environment; and modifying the simulated vehicle traffic using a ghost vehicle approximation model, responsive to a deteinii-nation that the lead vehicle is within a predeterrmned distance of the intersection, to provide simulated traffic flow distributions while maintaining incident avoidance criteria including prevention of abrupt swerving and unattainable braking characteristics, wherein:
using the ghost vehicle approximation model includes setting a predefined speed value with respect to a stationary road and a predefined gap distance value of a ghost vehicle positioned in front of at least one of the lead vehicle and the subsequent vehicle to modify the vehicle parameters of the at least one of the lead vehicle and the subsequent vehicle at each timestep; and
a current speed value of the ghost vehicle is modified as a function of a road angle such that V=(1+cos (θ))/2, where V represents the speed of the ghost vehicle, and θ represents the road angle.

2. The method of claim 1, further comprising testing at least one alternative roadway configuration in the simulated environment using the simulated traffic flow distributions to determine a difference in traffic flow.

3. The method of claim 2, further comprising modifying the virtual roadway configuration with the least one alternative roadway configuration when the difference in traffic flow occurs.

4. The method of claim 2, wherein the least one alternative roadway configuration includes at least one of an additional lane, a traffic signal, and a traffic pattern or combination thereof.

5. The method of claim 1, wherein the vehicle parameters include at least one of a position value, a speed value, and a gap distance value of the at least one of the subsequent vehicle and the lead vehicle.

6. The method of claim 1, wherein the simulating further comprises:
simulating vehicle traffic based on vehicle parameters of a turning vehicle at each timestep; and
modifying the simulated vehicle traffic using the ghost vehicle approximation model, wherein the ghost vehicle approximation model includes setting at least one of the speed value and the gap distance value for the ghost vehicle to modify the vehicle parameters of the turning vehicle at each timestep, the ghost vehicle being positioned in front of the turning vehicle.

7. The method of claim 6, wherein setting the speed value for the ghost vehicle includes determining the road angle between a first road and a target road connected by at least one intersection.

8. A traffic simulation system for simulating traffic flow configurations, comprising:
at least a processor and a memory device;
a car-following estimation unit, executed on the processor, to simulate vehicle traffic on a virtual roadway configuration in a simulated environment using a car-following model to provide simulated vehicle traffic at an intersection, wherein the car-following model includes vehicle parameters of at least one of a lead vehicle and a subsequent vehicle at each timestep, the lead vehicle positioned in front of the subsequent vehicle, and wherein intersections of non-primary roads are excluded from the simulated environment; and
a ghost vehicle approximation unit, executed on the processor, to modify the simulated vehicle traffic using a ghost vehicle approximation model, responsive to a determination that the lead vehicle is within a predetermined distance of the intersection, to provide simulated traffic flow distributions while maintaining incident avoidance criteria including prevention of abrupt swerving and unattainable braking characteristics, wherein:
using the ghost vehicle approximation model includes setting a predefined speed value with respect to a stationary road and a predefined gap distance value of a ghost vehicle positioned in front of at least one of the lead vehicle and the subsequent vehicle to modify the vehicle parameters of the at least one of the lead vehicle and the subsequent vehicle at each timestep; and
a current speed value of the ghost vehicle is modified as a function of a road angle such that V=(1+cos (θ))/2, where V represents the speed of the ghost vehicle, and θ represents the road angle.

9. The traffic simulation system of claim 8, further comprising a traffic estimation unit, executed on the processor, to test at least one alternative roadway configuration in the simulated environment using the simulated traffic flow distributions to determine a difference in traffic flow.

10. The traffic simulation system of claim 9, further comprising a traffic reassignment unit, executed on the processor, to modify the virtual roadway configuration with the least one alternative roadway configuration when the difference in traffic flow occurs.

11. The traffic simulation system of claim 8, wherein:
the car-following estimation unit is further configured to simulate vehicle traffic based on vehicle parameters of a turning vehicle at each timestep; and
the ghost vehicle approximation unit is further configured to modify the simulated vehicle traffic using the ghost vehicle approximation model, wherein the ghost vehicle approximation model includes setting at least one of the speed value and the gap distance value for the ghost vehicle to modify the vehicle parameters of the turning vehicle at each timestep, the ghost vehicle being positioned in front of the turning vehicle.

12. The traffic simulation system of claim 11, wherein setting the speed value for the ghost vehicle includes determining the road angle between a first road and a target road connected by at least one intersection.

13. A non-transitory computer readable storage medium comprising a computer readable program for simulating traffic flow configurations, wherein the computer readable program, when executed on a computer, causes the computer to perform the steps of:
simulating vehicle traffic on a virtual roadway configuration in a simulated environment using a car-following model to provide simulated vehicle traffic at an intersection, wherein the car-following model includes vehicle parameters of at least one of a lead vehicle and a subsequent vehicle at each timestep, the lead vehicle positioned in front of the subsequent vehicle, and wherein intersections of non-primary roads are excluded from the simulated environment; and
modifying the simulated vehicle traffic using a ghost vehicle approximation model, responsive to a determination that the lead vehicle is within a predetermined distance of the intersection, to provide simulated traffic flow distributions while maintaining incident avoidance criteria including prevention of abrupt swerving and unattainable braking characteristics, wherein:
using the ghost vehicle approximation model includes setting a predefined speed value with respect to a stationary road and a predefined gap distance value of a ghost vehicle positioned in front of at least one of the lead vehicle and the subsequent vehicle to modify the vehicle parameters of the at least one of the lead vehicle and the subsequent vehicle at each timestep; and a current speed value of the ghost vehicle is modified as a function of a road angle such that $V=(1+\cos(\theta))/2$, where V represents the speed of the ghost vehicle, and $\theta$ represents the road angle.

14. The non-transitory computer readable storage medium of claim 13, the method further comprising testing at least one alternative roadway configuration in the simulated environment using the simulated traffic flow distributions to determine a difference in traffic flow.

15. The non-transitory computer readable storage medium of claim 14, the method further comprising modifying the virtual roadway configuration with the least one alternative roadway configuration when the difference in traffic flow occurs.

16. The non-transitory computer readable storage medium of claim 14, wherein the least one alternative roadway configuration includes at least one of an additional lane, a traffic signal, and a traffic pattern or combination thereof.

17. The non-transitory computer readable storage medium of claim 13, wherein the vehicle parameters include at least one of a position value, a speed value, and a gap distance value of the at least one of the subsequent vehicle and the lead vehicle.

18. The non-transitory computer readable storage medium of claim 14, wherein the simulating further comprises:
   simulating vehicle traffic based on vehicle parameters of a turning vehicle at each timestep; and
   modifying the simulated vehicle traffic using the ghost vehicle approximation model, wherein the ghost vehicle approximation model includes setting at least one of the speed value and the gap distance value for the ghost vehicle to modify the vehicle parameters of the turning vehicle at each timestep, the ghost vehicle being positioned in front of the turning vehicle.

19. The non-transitory computer readable storage medium of claim 18, wherein setting the speed value for the ghost vehicle includes determining the road angle between a first road and a target road connected by at least one intersection.

* * * * *